(12) United States Patent
Park et al.

(10) Patent No.: US 8,405,071 B2
(45) Date of Patent: Mar. 26, 2013

(54) ORGANIC SEMICONDUCTOR POLYMER AND TRANSISTOR INCLUDING THE SAME

(75) Inventors: Jeong-il Park, Seongnam-si (KR); Ji-Youl Lee, Seoul (KR); Bang-Lin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 307 days.

(21) Appl. No.: 12/662,843

(22) Filed: May 6, 2010

(65) Prior Publication Data

US 2011/0049480 A1     Mar. 3, 2011

(30) Foreign Application Priority Data

Aug. 25, 2009    (KR) .......................... 10-2009-0078971

(51) Int. Cl.
     *H01L 51/30*      (2006.01)
(52) U.S. Cl. ..................... 257/40; 257/98; 257/E51.027; 257/E21.024; 526/256
(58) Field of Classification Search .................. 257/40, 257/98, 642–643, 759, E39.007, E51.001–E51.052, 257/E27.117–E27.119; 528/377
See application file for complete search history.

(56) References Cited

U.S. PATENT DOCUMENTS

| | | | |
|---|---|---|---|
| 5,946,551 A | 8/1999 | Dimitrakopoulos |
| 6,166,172 A | 12/2000 | McCullough |
| 6,232,157 B1 | 5/2001 | Dodabalapur |
| 6,872,801 B2 | 3/2005 | Ong |
| 6,897,284 B2 | 5/2005 | Liu |
| 6,949,762 B2 | 9/2005 | Ong |
| 7,837,903 B2 * | 11/2010 | Liu et al. ................. 252/500 |

OTHER PUBLICATIONS

Charge localization in polymeric metal oxide semiconductor.*
Anoop S. Dhoot, et al., "Beyond the Metal-Insulator Transition in Polymer Electrolyte Gated Polymer Field-Effect Transistors," PNAS Aug. 8, 2006, vol. 103, No. 32, pp. 11834-11837.
Hidetaka Nakanishi, et al., "Synthesis and Properties of the Longest Oligothiophenes: the Icosamer and Heptacosamer," Journal of Organic Chemistry, 1998, vol. 63, pp. 8632-8633.
John Stille, "The Palladium-Catalyzed Cross-Coupling Reactions of Organotin Reagents with Organic Electrophiles," Angew. Chem. Int. Ed. Engl. 1986, vol. 25, pp. 508-524.

(Continued)

*Primary Examiner* — Mamadou Diallo
(74) *Attorney, Agent, or Firm* — Harness, Dickey & Pierce, P.L.C.

(57) ABSTRACT

An organic semiconductor polymer and transistor are provided, the organic semiconductor polymer is represented by the following Chemical Formula (1)

Chemical Formula (1)

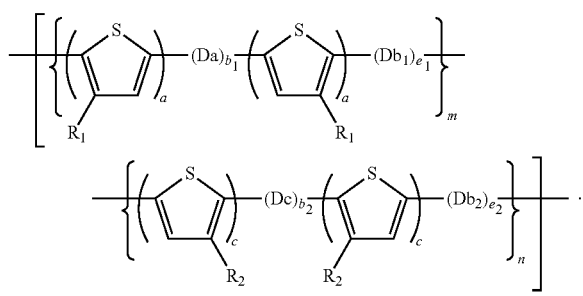

17 Claims, 6 Drawing Sheets

OTHER PUBLICATIONS

Norio Miyaura, et al. "Palladium-Catalyzed inter- and Intramolecular Cross-Coupling Reactions of B-Alkyl-9-borabicyclo[3.3.1]nonane Derivatives with 1-Halo-1-alkenes or Haloarenes. Syntheses of Functionalized Alkenes, Arenes, and Cycloalkenes via a Hydroboration-Coupling Sequence." J. Am. Chem. Soc. 1989, vol. 111, pp. 314-321.

Takakazu Yamamoto, et al., "Preparation of π-Conjugated Poly(thiophene-2, 5-diyl), Poly(p-phenylene), and Related Polymers Using Zerovalent Nickel Complexes. Linear Structure and Properties of the π-Conjugated Polymers." Macromolecules, 1992, vol. 25, pp. 1214-1223.

* cited by examiner

ORGANIC SEMICONDUCTOR POLYMER AND TRANSISTOR INCLUDING THE SAME

CROSS-REFERENCE TO RELATED APPLICATIONS

This application claims the benefit of priority under 35 U.S.C. §119 to Korean Patent Application No. 10-2009-0078971 filed in the Korean Intellectual Property Office on Aug. 25, 2009, the entire contents of which are incorporated herein by reference.

BACKGROUND

1. Field

Example embodiments relate to an organic semiconductor polymer and a transistor including the same.

2. Description of the Related Art

Progressing to an information-oriented society requires developing a new image display device that addresses the drawbacks of the conventional cathode ray tube (CRT) (including a heavy weight and/or a large volume). Several flat panel displays (e.g., a liquid crystal display (LCD), an organic light emitting diode (OLED) display, a plasma display panel (PDP), a surface-conduction electron-emitter display (SED) and similar devices) are drawing attention.

A thin film transistor (TFT) including a semiconductor layer of amorphous silicon is widely used for a switching device of the flat panel displays.

The amorphous silicon thin film transistor is widely used because it exhibits uniformity and increased electrical characteristics in a doping state, while retaining insulating characteristics in a non-doping state.

However, in order to deposit the conventional amorphous silicon thin film transistor on a substrate, there are limits in carrying out the process at a substantially high temperature of 300° C. It is difficult to apply the conventional amorphous silicon thin film transistor to a polymer substrate used to form a flexible display.

In order to solve the problems, an organic thin film transistor (OTFT) using an organic semiconductor material has been suggested.

The organic thin film transistor generally includes a substrate, a gate electrode, an insulation layer, a source electrode, a drain electrode and a channel region. The organic thin film transistor may be classified as a bottom contact (BC) type in which a channel region is formed on the source electrode and the drain electrode or a top contact (TC) type of which a metal electrode is formed on the channel region due to mask deposition.

A low molecular, or oligomer, organic semiconductor material filled in the channel region of the organic thin film transistor (OTFT) may include merocyanine, phthalocyanine, perylene, pentacene, C60, a thiophene oligomer and similar compounds. The low molecular, or oligomer, organic semiconductor material may be a thin film formed on the channel region according to a vacuum process.

SUMMARY

Example embodiments relate to an organic semiconductor polymer and a transistor including the same.

Example embodiments provide an organic semiconductor polymer having increased solubility in an organic solvent and increased coplanarity. Example embodiments provide an organic semiconductor polymer capable of realizing higher transistor charge mobility and/or lower off-state current loss when applied to an active layer (or region) of a transistor.

Example embodiments also provide a transistor including the organic semiconductor polymer.

Yet other example embodiments provide an electronic device including the organic semiconductor polymer.

According to example embodiments, an organic semiconductor polymer represented by the following Chemical Formula (1) is provided.

Chemical Formula (1)

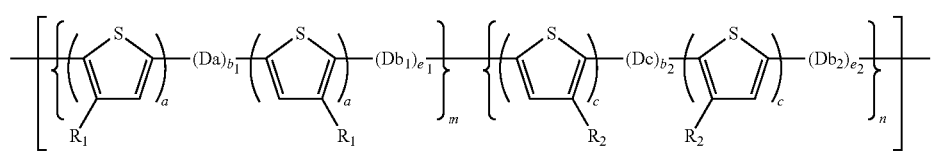

In the above Chemical Formula (1), $R_1$ and $R_2$ are the same or different, and are independently selected from the group consisting of a substituted or unsubstituted C1 to C20 linear or branched alkyl, a substituted or unsubstituted C3 to C20 cycloalkyl, a substituted or unsubstituted C1 to C20 alkoxyalkyl, a substituted or unsubstituted C1 to C20 linear or branched alkoxy, a substituted or unsubstituted C3 to C20 oxycycloalkyl, a substituted or unsubstituted C6 to C20 oxyaryl, a fluoro, a C1 to C20 perfluoroalkyl, a substituted or unsubstituted C1 to C20 fluoroalkyl and combinations thereof.

In Chemical Formula (1), Da, $Db_1$, $Db_2$, and Dc are the same or different, and are independently selected from the group consisting of a substituted or unsubstituted C2 to C30 heteroaromatic group, a substituted or unsubstituted C6 to C30 condensed polycyclic group, a substituted or unsubstituted C6 to C30 arylene, a substituted or unsubstituted C2 to C30 heteroaromatic group including at least one electron-withdrawing imine nitrogen atom and combinations thereof.

In Chemical Formula (1), a is from 1 to 4, $b_1$ and $b_2$ is from 0 to 4, c is from 1 to 4, $e_1$ and $e_2$ is from 0 to 3, and m and n denote a mole ratio of each repeating unit and the ratio of m:n is from 10:1 to 1:10.

Da, $Db_1$, $Db_2$ and Dc may be functional groups represented by one of the structures shown in the following Chemical Formula (2).

Chemical Formula (2)

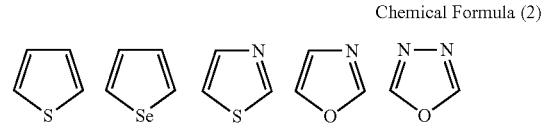

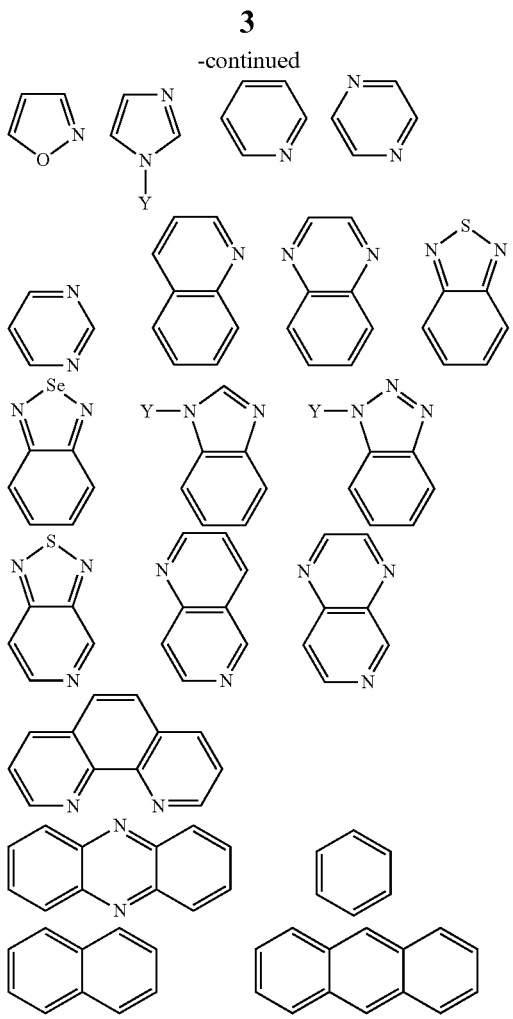

In the structures shown in above Chemical Formula (2), Y is hydrogen, a C1 to C20 linear or branched alkyl, a C3 to C20 cycloalkyl, a C6 to C30 aryl, a C1 to C16 linear or branched alkoxy, or a C3 to C16 cycloalkoxyalkyl.

The C2 to C30 heteroaromatic group may be thiophene or thienothiophene.

The C2 to C30 heteroaromatic group including at least one electron-withdrawing imine nitrogen atom may include thiazole, thiadiazole, oxazole, isoxazole, oxadiazole, imidazole, pyrazole, triazole, tetrazole, pyridine, pyridazine, quinoline, isoquinoline, quinoxaline, naphthyridine, benzoimidazole, pyrimidine, pyrimidopyrimidine, benzothiadiazole, benzoselenadiazole, benzotriazole, benzothiazole, benzooxazole, phenanthroline, phenazine, pyrazine, triazine, pyridopyrimidine, phenaphthyridine or combinations thereof.

The organic semiconductor polymer may be a polymer including at least one of repeating unit represented by the following Chemical Formulae (1-1), (1-2), (1-3) or combinations thereof.

Chemical Formula (1-1)

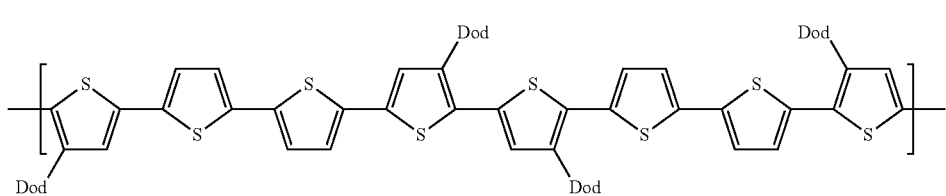

Chemical Formula (1-2)

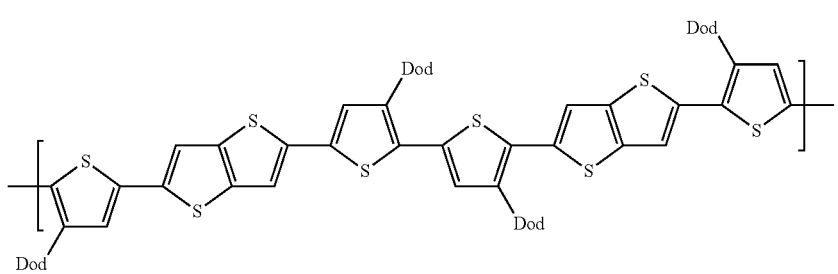

Chemical Formula (1-3)

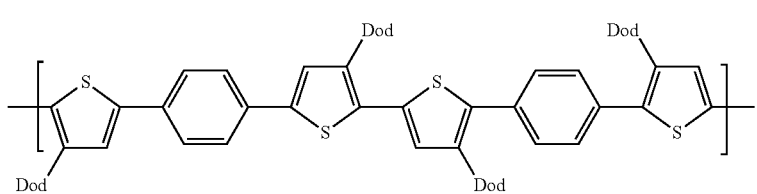

In the above Chemical Formulae (1-1) to (1-3), Dod denotes a dodecyl ($C_{12}H_{25}$).

The organic semiconductor polymer may include a terminal functional group represented by one of the following Chemical Formulae (3) to (6).

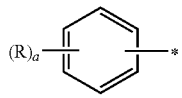

Chemical Formula (3)

In the above Chemical Formula (3), R is a fluoro or a C1 to C20 perfluoroalkyl, and a is an integer ranging from 1 to 5.

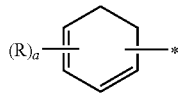

Chemical Formula (4)

In the above Chemical Formula (4), R is a fluoro or a C1 to C20 perfluoroalkyl, and a is an integer ranging from 1 to 6.

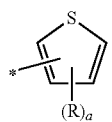

Chemical Formula (5)

In the above Chemical Formula (5), R is a fluoro or a C1 to C20 perfluoroalkyl, and a is an integer ranging from 1 to 3.

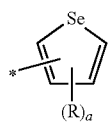

Chemical Formula (6)

In the above Chemical Formula (6), R is a fluoro or a C1 to C20 perfluoroalkyl, and a is an integer ranging from 1 to 3.

According to example embodiments, a transistor including the organic semiconductor polymer is provided.

The transistor includes a gate electrode positioned on a substrate, a source electrode and a drain electrode facing each other and defining a channel region, an insulation layer that electrically insulates the source electrode, the drain electrode and the gate electrode, and an active layer in the channel region. The active layer may include the organic semiconductor polymer.

According to example embodiments, an electronic device including the organic semiconductor polymer is provided.

BRIEF DESCRIPTION OF THE DRAWINGS

Example embodiments will be more clearly understood from the following detailed description taken in conjunction with the accompanying drawings.

FIG. 1 is a schematic cross-sectional view of a transistor according to example embodiments.

FIG. 2 is a schematic cross-sectional view of a transistor according to example embodiments.

FIG. 3 shows $^1$H NMR spectrum of the polymer according to Example 1.

FIG. 4 shows $^1$H NMR spectrum of the polymer according to Example 2.

FIG. 5 is a graph showing results of current-transfer characteristics of the organic thin film transistor (OTFT) device according to Example 3.

FIG. 6 is a graph showing results of current-transfer characteristics of the organic thin film transistor (OTFT) device according to Example 4.

FIG. 7 is a graph showing results of current-transfer characteristics of the organic thin film transistor (OTFT) device according to Comparative Example 1.

DETAILED DESCRIPTION OF EXAMPLE EMBODIMENTS

Figure 1:
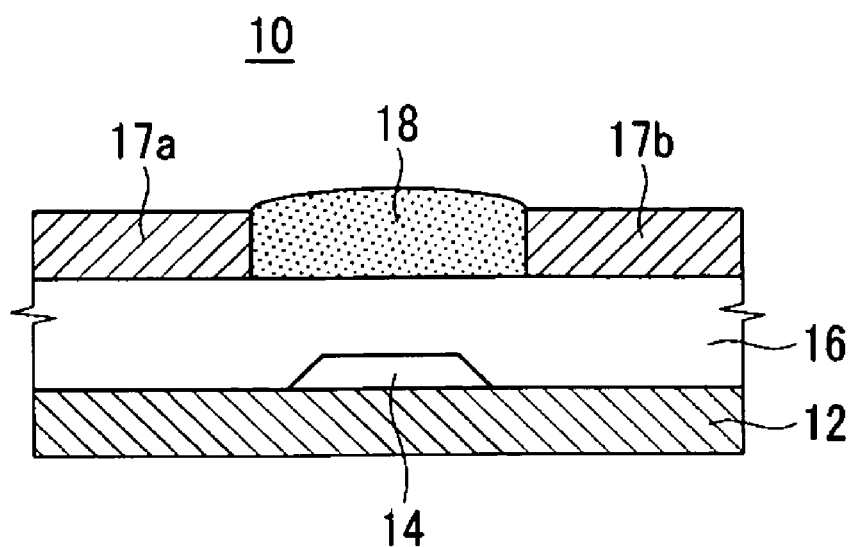
FIGS. 1-7 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

This disclosure will be described more fully hereinafter with reference to the accompanying drawings, in which example embodiments are shown. This disclosure may, however, be embodied in many different forms and is not construed as limited to the example embodiments set forth herein.

In the drawings, the thickness of layers, films, panels, etc., are exaggerated for clarity. Like reference numerals designate like elements throughout the specification. It will be understood that when an element (e.g., a layer, film or substrate) is referred to as being "on" another element, it can be directly on the other element or intervening elements may be present. In contrast, when an element is referred to as being "directly on" another element, there are no intervening elements present.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term "heteroaromatic group" refers to a C2 to C30 heteroaryl, or a C3 to C30 heterocycloalkenyl. As used herein, when a definition is not otherwise provided, the term "condensed polycyclic group" refers to a fused ring of at least two cyclic groups selected from the group consisting of an aromatic group, a heteroaromatic group, a C3 to C30 cycloalkyl, and a C3 to C30 cycloalkenyl.

As used herein, when specific definition is not otherwise provided, the term "hetero" refers to one including heteroatoms selected from the group consisting of N, O, S, Si, and P, and including 1 to 4 heteroatoms in one ring.

As used herein, when specific definition is not otherwise provided, the term "substituted" refers to one substituted with at least a functional group selected from the group consisting of a fluoro, a C1 to C20 linear or branched alkyl, a C3 to C20 cycloalkyl, a C1 to C20 fluoroalkyl, a C1 to C20 perfluoroalkyl ($C_nF_{2n+1}$), a C1 to C20 linear or branched alkoxy, a C3 to C20 cycloalkoxy, a C2 to C20 linear or branched alkoxyalkyl, a C4 to C30 cycloalkoxyalkyl and combinations thereof.

Example embodiments relate to an organic semiconductor polymer and a transistor including the same.

According to example embodiments, an organic semiconductor polymer represented by the following Chemical Formula (1) is provided.

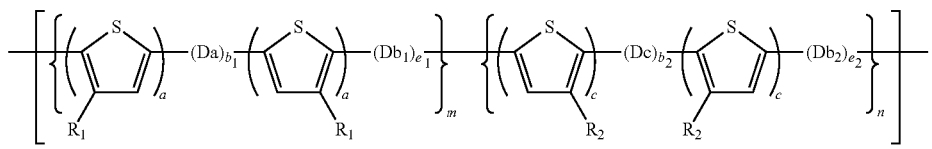

Chemical Formula (1)

In the above Chemical Formula (1), $R_1$ and $R_2$ are the same or different, and are independently selected from the group consisting of a substituted or unsubstituted C1 to C20 linear or branched alkyl, a substituted or unsubstituted C3 to C20 cycloalkyl, a substituted or unsubstituted C1 to C20 alkoxyalkyl, a substituted or unsubstituted C1 to C20 linear or branched alkoxy, a substituted or unsubstituted C3 to C20 oxycycloalkyl, a substituted or unsubstituted C6 to C20 oxyaryl, a fluoro, a C1 to C20 perfluoroalkyl, a substituted or unsubstituted C1 to C20 fluoroalkyl and combinations thereof.

In Chemical Formula (1), Da, $Db_1$, $Db_2$ and Dc are the same or different, and are independently selected from the group consisting of a substituted or unsubstituted C2 to C30 heteroaromatic group, a substituted or unsubstituted C6 to C30 condensed polycyclic group, a substituted or unsubstituted C6 to C30 arylene, a substituted or unsubstituted C2 to C30 heteroaromatic group including at least one electron-withdrawing imine nitrogen atom and combinations thereof.

In Chemical Formula (1), a is from 1 to 4, $b_1$ and $b_2$ is from 0 to 4. In other example embodiments, a is from 1 to 4. In Chemical Formula (1), c is from 1 to 4, $e_1$ and $e_2$ is from 0 to 3, and m and n denotes a mole ratio of each repeating unit and the ratio of m:n is from 10:1 to 1:10.

In Chemical Formula (1), Da, $Db_1$, $Db_2$ and Dc may be functional groups represented by one of the structures shown in the following Chemical Formula (2), but are not limited thereto.

Chemical Formula (2)

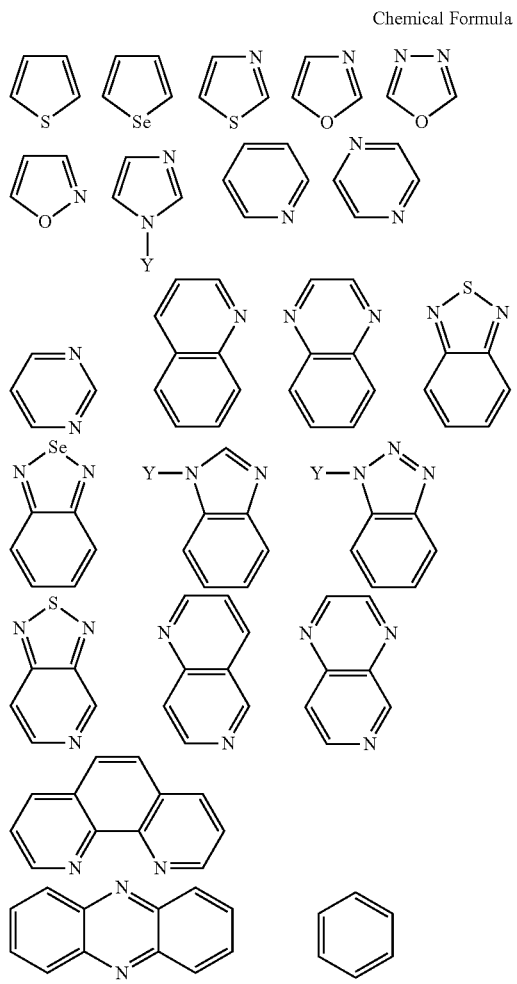

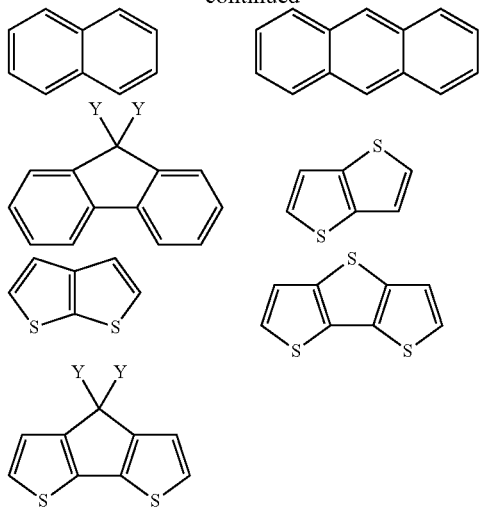

In the structures shown in above Chemical Formula (2), Y is hydrogen, a C1 to C20 linear or branched alkyl, a C3 to C20 cycloalkyl, a C6 to C30 aryl, a C1 to C16 linear or branched alkoxy, or a C3 to C16 cycloalkoxyalkyl. If more than one Y is present in Chemical Formula (2), the Ys may be the same or different from each other.

The C2 to C30 heteroaromatic group may be thiophene or thienothiophene.

The C2 to C30 heteroaromatic group including at least one electron-withdrawing imine nitrogen atom may include thiazole, thiadiazole, oxazole, isoxazole, oxadiazole, imidazole, pyrazole, triazole, tetrazole, pyridine, pyridazine, quinoline, isoquinoline, quinoxaline, naphthyridine, benzoimidazole, pyrimidine, pyrimidopyrimidine, benzothiadiazole, benzoselenadiazole, benzotriazole, benzothiazole, benzooxazole, phenanthroline, phenazine, pyrazine, triazine, pyridopyrimidine, phenaphthyridine or combinations thereof.

The organic semiconductor polymer may be a polymer including one of the repeating units represented by the following Chemical Formulae (1-1), (1-2), (1-3) or combinations thereof.

Chemical Formula (1-1)

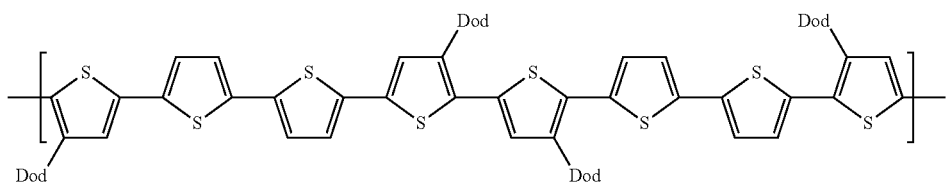

Chemical Formula (1-2)

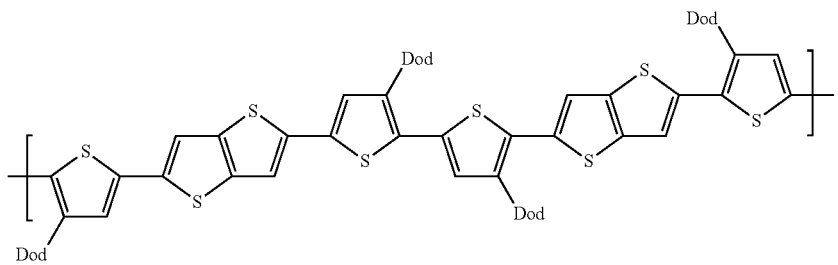

Chemical Formula (1-3)

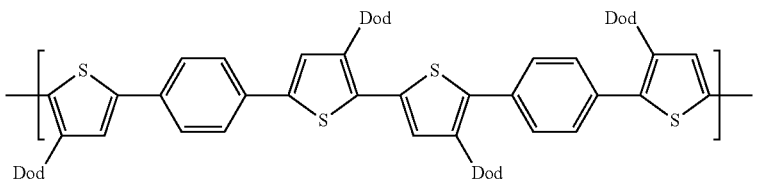

In the above Chemical Formulae (1-1) to (1-3), Dod denotes a dodecyl ($C_{12}H_{25}$).

The organic semiconductor polymer may include a terminal functional group represented by one of the following Chemical Formulae (3) to (6).

Chemical Formula (3)

$(R)_a$—⌬—*

In the above Chemical Formula (3), R is a fluoro or a C1 to C20 perfluoroalkyl, and a is an integer ranging from 1 to 5.

Chemical Formula (4)

$(R)_a$—⌬—*

In the above Chemical Formula (4), R is a fluoro or a C1 to C20 perfluoroalkyl, and a is an integer ranging from 1 to 6.

Chemical Formula (5)

*—[thiophene]—$(R)_a$

In the above Chemical Formula (5), R is a fluoro or a C1 to C20 perfluoroalkyl, and a is an integer ranging from 1 to 3.

Chemical Formula (6)

*—[selenophene]—$(R)_a$

In the above Chemical Formula (6), R is a fluoro or a C1 to C20 perfluoroalkyl, and a is an integer ranging from 1 to 3.

The organic semiconductor polymer may have a number average molecular weight (Mn) of about 10,000 to about 100,000. When the organic semiconductor polymer has the above ranged number average molecular weight, dissolution (or solubility) in an organic solvent may increase and a thin film having increased crystallinity may be obtained.

The organic semiconductor polymer may include at least two repeating units, having symmetrical structures different from each other, wherein the substituents of thiophene, a plurality of $R_1$ groups and a plurality of $R_2$ groups are present symmetrical to each other in one of the respective repeating units. The organic semiconductor polymer may be an alternating, or random, polymer including a repeating unit having a symmetrical structure. The organic semiconductor polymer including at least two repeating units having symmetrical structures different from each other has increased solubility in an organic solvent and increased coplanarity. With the organic semiconductor polymer, including at least two repeating units having symmetrical structures different from each other, it is possible to realize a transistor having higher charge mobility and/or lower off-state current loss when the organic semiconductor polymer is applied to an active layer of the transistor.

The organic semiconductor polymer may be a p-type organic semiconductor polymer.

The organic semiconductor polymer represented by the above Chemical Formula (1) may be synthesized according to methods disclosed in Stille et al. (Angew. Chem. Int. Ed. Engl. 1986, Vol. 25, pp. 508-524), Suzuki et al. (J. Am. Chem. Soc: 1989, Vol. 111, pp. 314-321), McCullough et al. (U.S. Pat. No. 6,166,172, 1999) or Yamamoto et al. (Macromolecules 1992, Vol. 25, pp. 1214-1226). The organic semiconductor polymer may be synthesized according to the following Reaction Scheme (1) or (2).

Reaction Scheme (1)

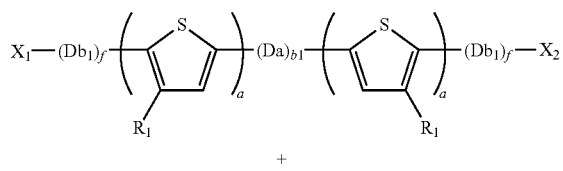

+

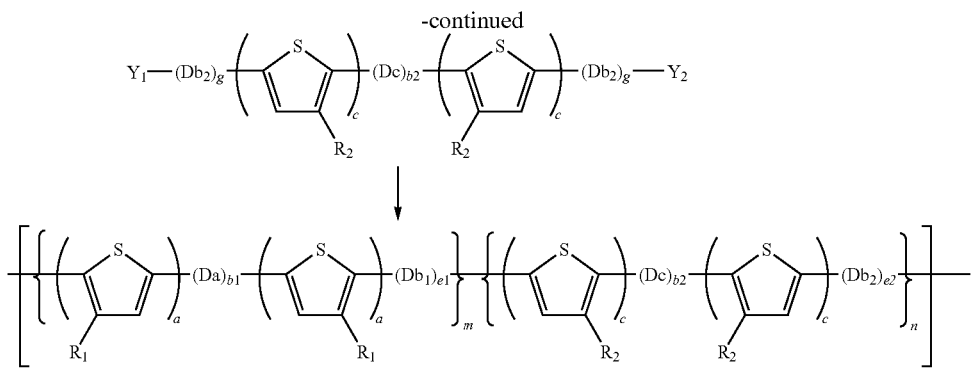

In the Reaction Scheme (1), $X_1$, $X_2$, $Y_1$ and $Y_2$ are independently reactive groups selected from the group consisting of a halogen (e.g., Br, I, Cl and/or other halogen elements), trialkyl tin, a borane group and combinations thereof. However, example embodiments are not limited thereto. $R_1$, $R_2$, Da, $Db_1$, $Db_2$, Dc, a, $b_1$, $b_2$, c, $e_1$, $e_2$, m and n are the same as defined in the above Chemical Formula (1), and f+g is the same as $e_1$ (i.e., f+g=$e_1$).

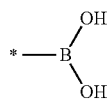

Chemical Formula (8)

Reaction Scheme (2)

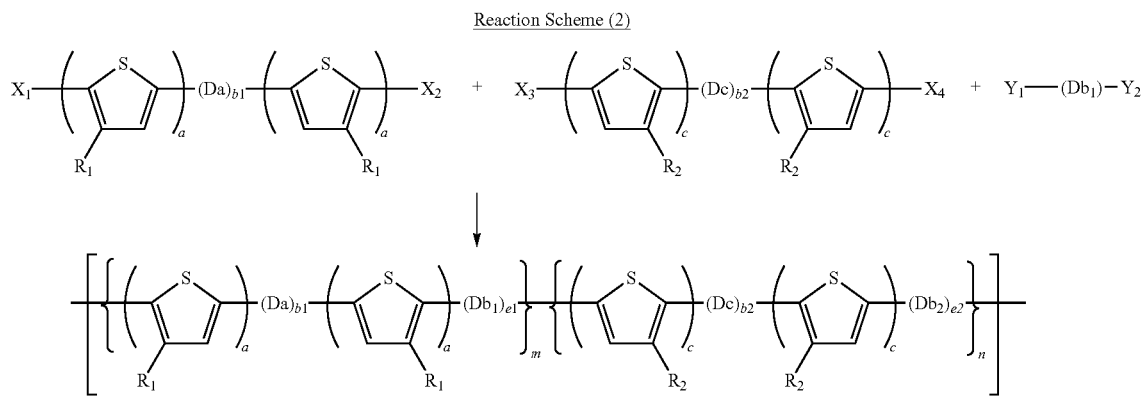

In the Reaction Scheme (2), $X_1$, $X_2$, $X_3$, $X_4$, $Y_1$ and $Y_2$ are independently reactive groups selected from the group consisting of a halogen (e.g., Br, I, Cl and/or other halogen elements), trialkyl tin, a borane group and combinations thereof. However, example embodiments are not limited thereto. $R_1$, $R_2$, Da, $Db_1$, $Db_2$, Dc, a, $b_1$, $b_2$, c, $e_1$, $e_2$, m and n are the same as defined in the above Chemical Formula (1).

The trialkyl tin of Reaction Schemes (1) and (2) may be represented by the following Chemical Formula (7), and the borane group of Reaction Schemes (1) and (2) may be represented by the following Chemical Formula (8) or (9).

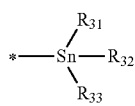

Chemical Formula (7)

In the above Chemical Formula (7), $R_{31}$ to $R_{33}$ are the same or different and are independently hydrogen or a C1 to C7 alkyl, provided that at least one of $R_{31}$ to $R_{33}$ is an alkyl.

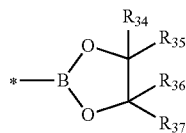

Chemical Formula (9)

In the above Chemical Formula (9), $R_{34}$ to $R_{37}$ are the same or different and are independently hydrogen or a C1 to C7 alkyl, provided that at least one of $R_{34}$ to $R_{37}$ is an alkyl.

A catalyst may be used in the reaction of the Reaction Scheme (1). The catalyst may be an organic metal catalyst represented by the following Chemical Formulae (9-1) to (9-4).

$Pd(L_1)_x$  Chemical Formula (9-1)

$Pd(L_2)_{4-y}Cl_y$  Chemical Formula (9-2)

In the above Chemical Formulae (9-1) and (9-2), $L_1$ and $L_2$ are ligands selected from the group consisting of triphenylphosphine (PPh$_3$), 1,4-bis(diphenylphosphine)butane (dppb), 1,1'-bis(diphenylphosphino)ferrocene (dppf), acetate (OAc), triphenyl arsine (AsPh$_3$), triphenylphosphite (P(OPh)$_3$) and combinations thereof. In Chemical Formula (9-1), x is an integer ranging from 2 to 4. In Chemical Formula (9-2), y is an integer ranging from 1 to 3.

 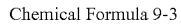

Chemical Formula 9-3

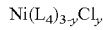

In the above Chemical Formulae (9-3) and (9-4), L$_3$ and L$_4$ are ligands selected from the group consisting of a diphenylphosphinophosphinoalkane (e.g., 1,3-bis(diphenylphosphino) propane (dppp), 1,2-bis(diphenylphosphino)ethane (dppe), 1,4-diphenylphosphinobutane (dppb) and similar compounds), a cycloalkene (e.g., bis(1,5-cyclooctadiene) (COD) and similar compounds) and combinations thereof. In Chemical Formula (9-3), x is an integer of 2 or 3. In Chemical Formula (9-4), y is an integer of 1 or 2.

Examples of palladium catalysts include a palladium (0) catalyst (e.g., a tetrakis(triphenylphosphine)palladium (0) compound (Pd(PPh$_3$)$_4$)) and palladium (II) catalysts (e.g., 1,4-bis(triphenylphosphine)palladium(II) dichloride (PdCl$_2$ PPh$_{3\ 2}$), [1,4-bis(diphenylphosphine)butane]palladium (II) dichloride (Pd(dppb)Cl$_2$), [1,1'-bis(diphenylphosphino)ferrocene]palladium (II) dichloride (Pd(dppf)Cl$_2$), palladium (II) acetate (Pd(OAc)$_2$) and similar compounds).

Examples of nickel catalysts include a nickel (0) catalyst (e.g., a bis(1,5-cyclooctadiene) nickel (0) compound (Ni (COD)$_2$)) and a nickel (II) catalyst (e.g., 1,3-diphenylphosphinopropane nickel (II) chloride (Ni(dppp)Cl$_2$), 1,2-bis (diphenylphosphino)ethane nickel (II) chloride (Ni(dppe) Cl$_2$) and similar compounds).

The amount of catalyst used may depend (or by adjusted accordingly) to the amount of the monomer(s). For example, the tetrakis(triphenylphosphine)palladium (0) compound may be used at about 0.2-mol % to about 15-mol % with respect to monomers. In other example embodiments, the tetrakis(triphenylphosphine)palladium (0) compound may be used at about 2-mol % to about 10-mol % with respect to monomers.

A polymerization solvent (e.g., toluene, dimethylformamide (DMF), tetrahydrofuran (THF), N-methylpyrrolidone (NMP) and similar solvents may be used.

A condensation reaction may be performed at about 80° C. to about 120° C. for about 1 hour to about 48 hours under a nitrogen atmosphere.

The organic semiconductor polymer may be applied to an active layer of a transistor. The transistor includes a gate electrode positioned on a substrate, a source electrode and a drain electrode facing each other and defining a channel region, an insulation layer that electrically insulates the source electrode, and the drain electrode and the gate electrode, and an active layer including the organic semiconductor polymer in the channel region.

The active layer may be prepared by a solution process of a composition including an organic semiconductor polymer (e.g., screen printing, printing, spin coating, dipping, ink jetting and similar processes). When the active layer is obtained by a solution process, the process costs may decrease. As such, the organic semiconductor polymer according to example embodiments is useful for fabricating a substantially large area device.

Figure 2:
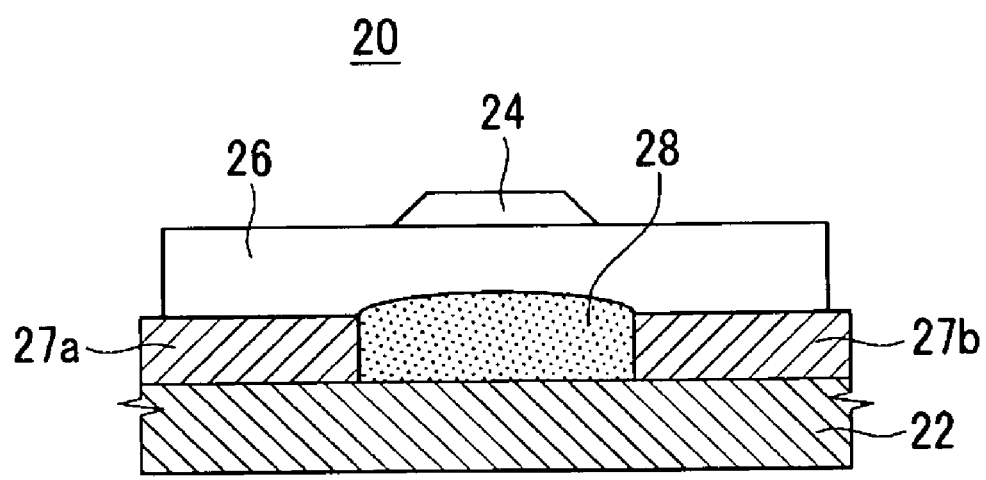

FIGS. 1 and 2 are schematic cross-sectional views showing a transistor according to example embodiments. The transistor according to example embodiments may be a thin film transistor. The thin film transistor may be a thin film having a thickness of several nanometers (nm) to several meters (m).

Referring to FIG. 1, a transistor 10 includes a substrate 12, a gate electrode 14 disposed on the substrate, and an insulation layer 16 covering the gate electrode 14. On the insulation layer 16, a source electrode 17a and a drain electrode 17b defining a channel region are provided, and an active layer 18 is provided in the channel region. The active layer 18 includes an organic semiconductor polymer according to example embodiments.

Referring to FIG. 2, in a transistor 20, a source electrode 27a and a drain electrode 27b defining a channel region are formed on a substrate 22, and an active layer 28 is formed on the channel region. The active layer 28 includes an organic semiconductor polymer according to example embodiments. An insulation layer 26 may be formed to cover the source electrode 27a, the drain electrode 27b, and the active layer 28. A gate electrode 24 is formed thereon.

The substrates 12 and 22 may include an inorganic material, an organic material, or a composite of an inorganic material and an organic material. The organic material may include, for example, a plastic (e.g., polyethylene naphthalate (PEN), polyethylene terephthalate (PET), polycarbonate, polyvinylalcohol, polyacrylate, polyimide, polynorbornene and polyethersulfone (PES)), and the inorganic material may include, for example, glass or metal.

The gate electrodes 14 and 24, source electrodes 17a and 27a, and drain electrodes 17b and 27b may include a generally-used, well-known metal, particularly gold (Au), silver (Ag), aluminum (Al), nickel (Ni), or indium tin oxide (ITO), without limitation.

The insulation layers 16 and 26 may include a generally-used, well-known insulator having a substantially high dielectric constant, particularly a ferroelectric insulator (e.g., Ba$_{0.33}$Sr$_{0.66}$TiO$_3$ (BST, barium strontium titanate), Al$_2$O$_3$, Ta$_2$O$_5$, La$_2$O$_5$, Y$_2$O$_3$, and TiO$_2$), an inorganic insulator (e.g., PbZr$_{0.33}$Ti$_{0.66}$O$_3$ (PZT), Bi$_4$Ti$_3$O$_{12}$, BaMgF$_4$, SrBi$_2$(TaNb)$_2$ O$_9$, Ba(ZrTi)O$_3$(BZT), BaTiO$_3$, SrTiO$_3$, Bi$_4$Ti$_3$O$_{12}$, SiO$_2$, SiN$_x$, AlON or similar insulators) or an organic insulator (e.g., polyimide, benzocyclobutane (BCB), parylene, polyacrylate, polyvinylalcohol, polyvinylphenol or similar insulators). However, example embodiments are not limited thereto. According to other example embodiments, the inorganic insulator disclosed in U.S. Pat. No. 5,946,551 and the organic insulator disclosed in U.S. Pat. No. 6,232,157 may be used for the insulation layers 16 and 26.

The organic semiconductor polymer may be applied to a memory device, an organic light emitting diode (OLED), a photosensor, a laser device and a photovoltaic device (e.g., a solar cell).

Hereinafter, this disclosure is illustrated in more detail with reference to examples. However, they are example embodiments of this disclosure and are not limiting.

EXAMPLES

Example 1

Synthesis of an alternating copolymer of 3,3‴-diodecyl-2,2':5,2":5",2‴-quaterthiophene and 4,4‴-didodecyl-2,2':5',2":5",2‴-quaterthiophene

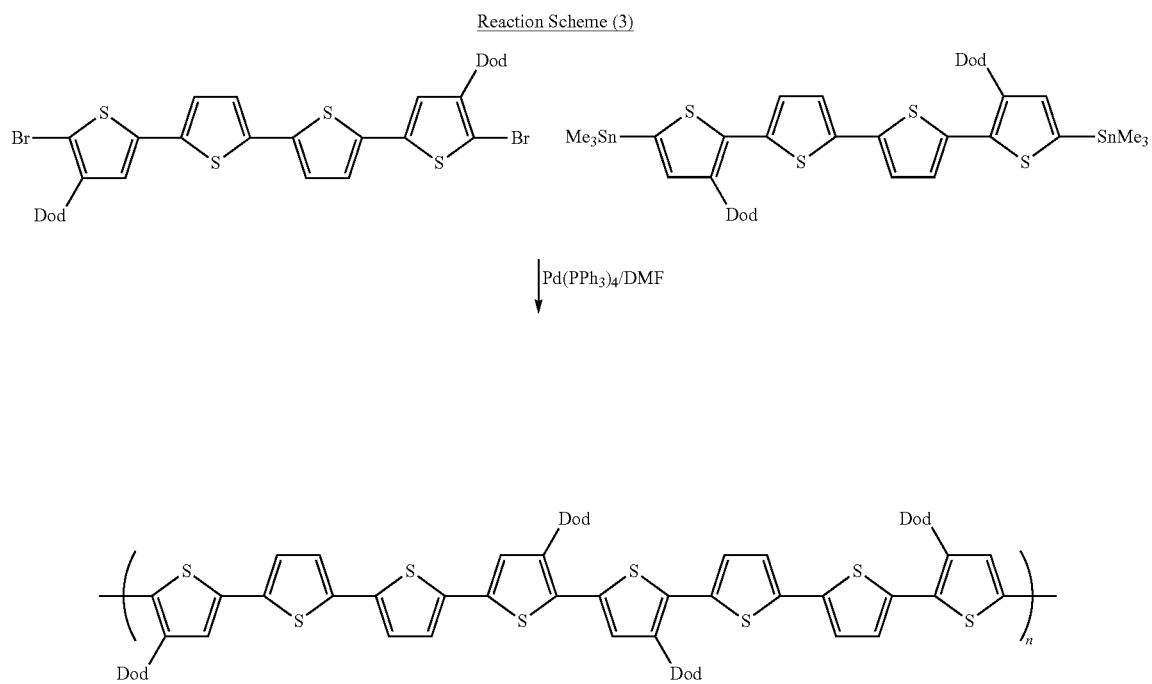

Reaction Scheme (3)

As shown in the Reaction Scheme (3), 5,5‴-di(trimethylstannyl)-3,3‴-didodecyl-2,2':5',2":5",2‴-quaterthiophene (0.3 mmol) and 5,5‴-dibromo-4,4‴-didodecyl-2,2':5',2":5",2‴-quaterthiophene (0.3 mmol) are dissolved in dimethyl formamide (DMF, 20 mL) in a flask and heated to about 90° C. Pd(PPh$_3$)$_4$ (2 mol %) is added to the reaction mixture. After reaction for 6 hours, 2-tributylstannylthiophene (1 mL) is added and agitated for 12 hours over which time the temperature of the mixture cools to room temperature and the reaction reaches completion. The resulting product is diluted with chloroform, and then sequentially washed with a 1N HCl solution, water three times, a 10% ammonia aqueous solution, and water three times. The chloroform solution layer is dried under reduced pressure concentration to a polymeric material, and then subjected to a Soxhlet extraction using methanol, acetone, dichloromethane and chloroform. The chloroform-extracted material is concentrated to obtain a polymer having a repeating unit of Chemical Formula (1-1) (yield: 23%, number average molecular weight=75,000).

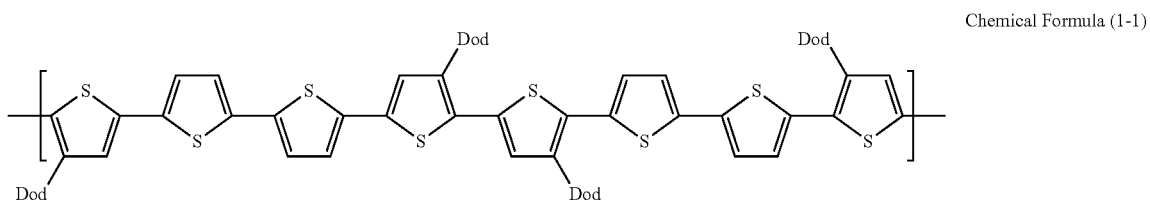

Chemical Formula (1-1)

In the above Chemical Formula (1-1), Dod denotes a dodecyl ($C_{12}H_{25}$).

Figure 3:
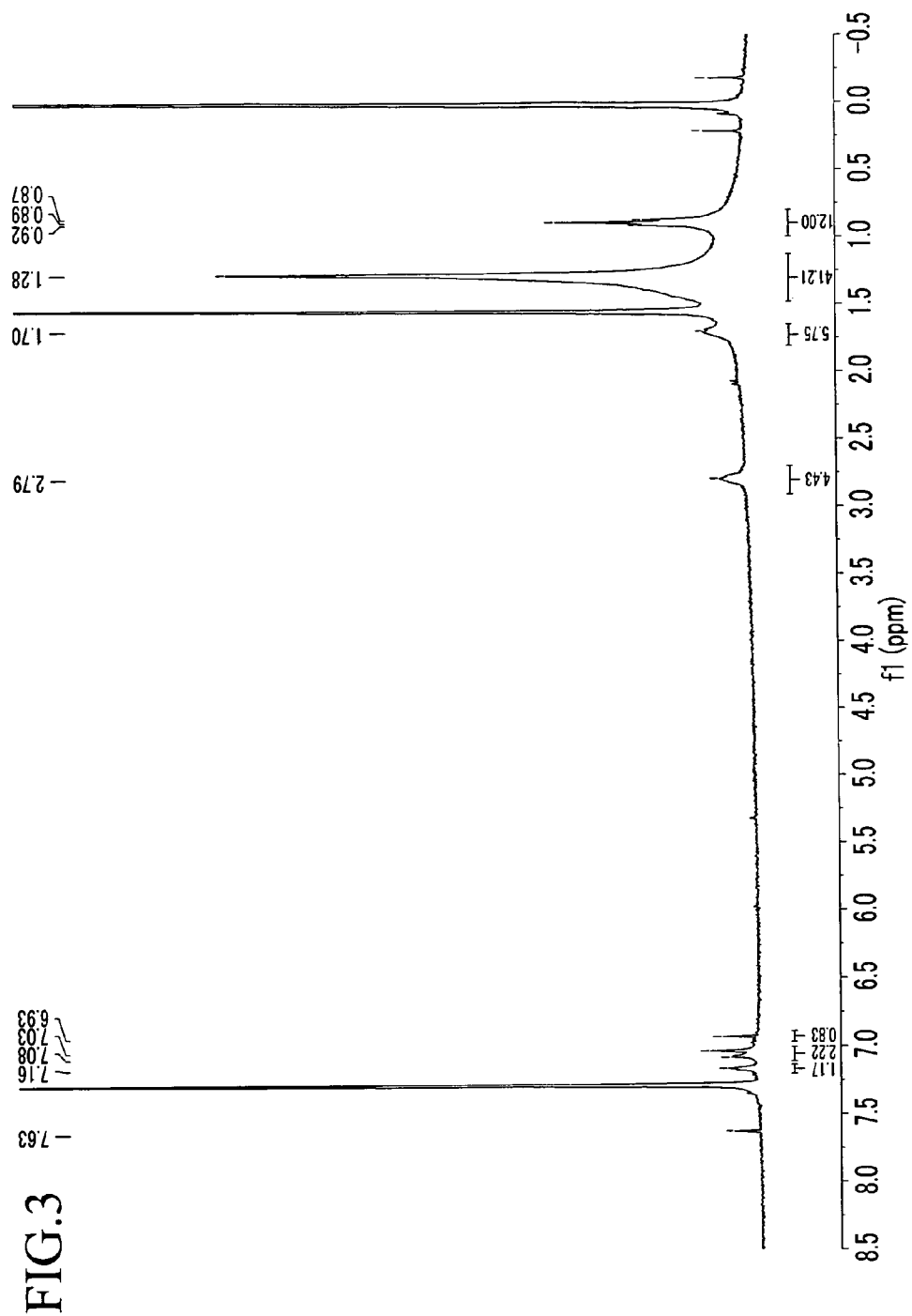

The $^1$H NMR of the compound of above Chemical Formula (1-1) is shown in FIG. 3.

Example 2

Synthesis of a random copolymer of 3,3'''-didodecyl-2,2':5',2'':5'',2'''-quaterthiophene and 4,4'''-didodecyl-2,2':5',2'':5'',2'''-quaterthiophene Reaction Scheme (4)

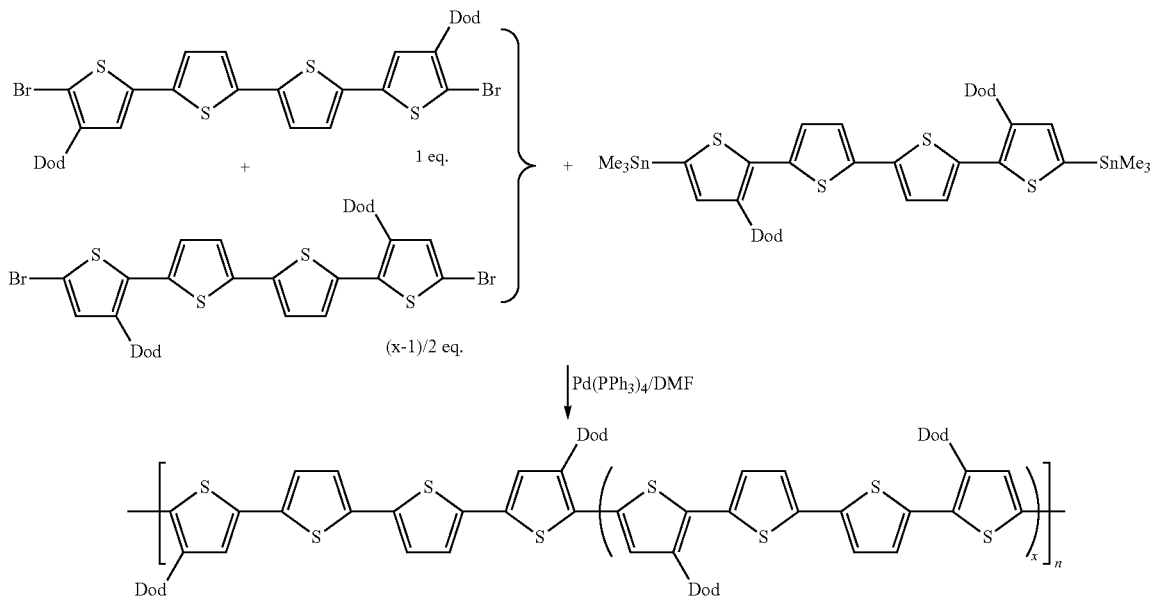

A polymer (yield: 21%, number average molecular weight=88,000) including a repeating unit of the following Chemical Formula (1-4) is obtained according to the same method as in Example (1), except for using 5,5'''-di(trimethylstannyl)-3,3'''-didodecyl-2,2':5',2'':5'',2'''-quaterthiophene (0.3 mmol), 5,5'''-dibromo-4,4'''-didodecyl-2,2':5',2'':5'',2'''-quaterthiophene (0.15 mmol), and 5,5'''-dibromo-4,4'''-didodecyl-2,2':5',2'':5'',2'''-quaterthiophene (0.15 mmol).

Chemical Formula (1-4)

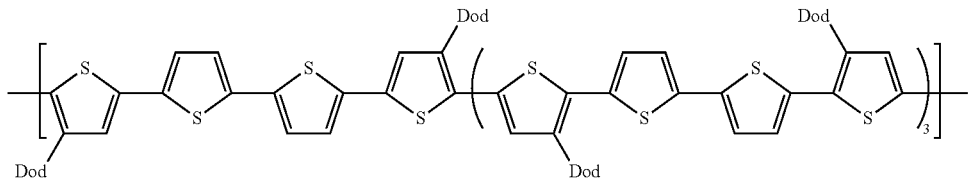

In the above Chemical Formula (1-4), Dod denotes a dodecyl ($C_{12}H_{25}$).

Figure 4:
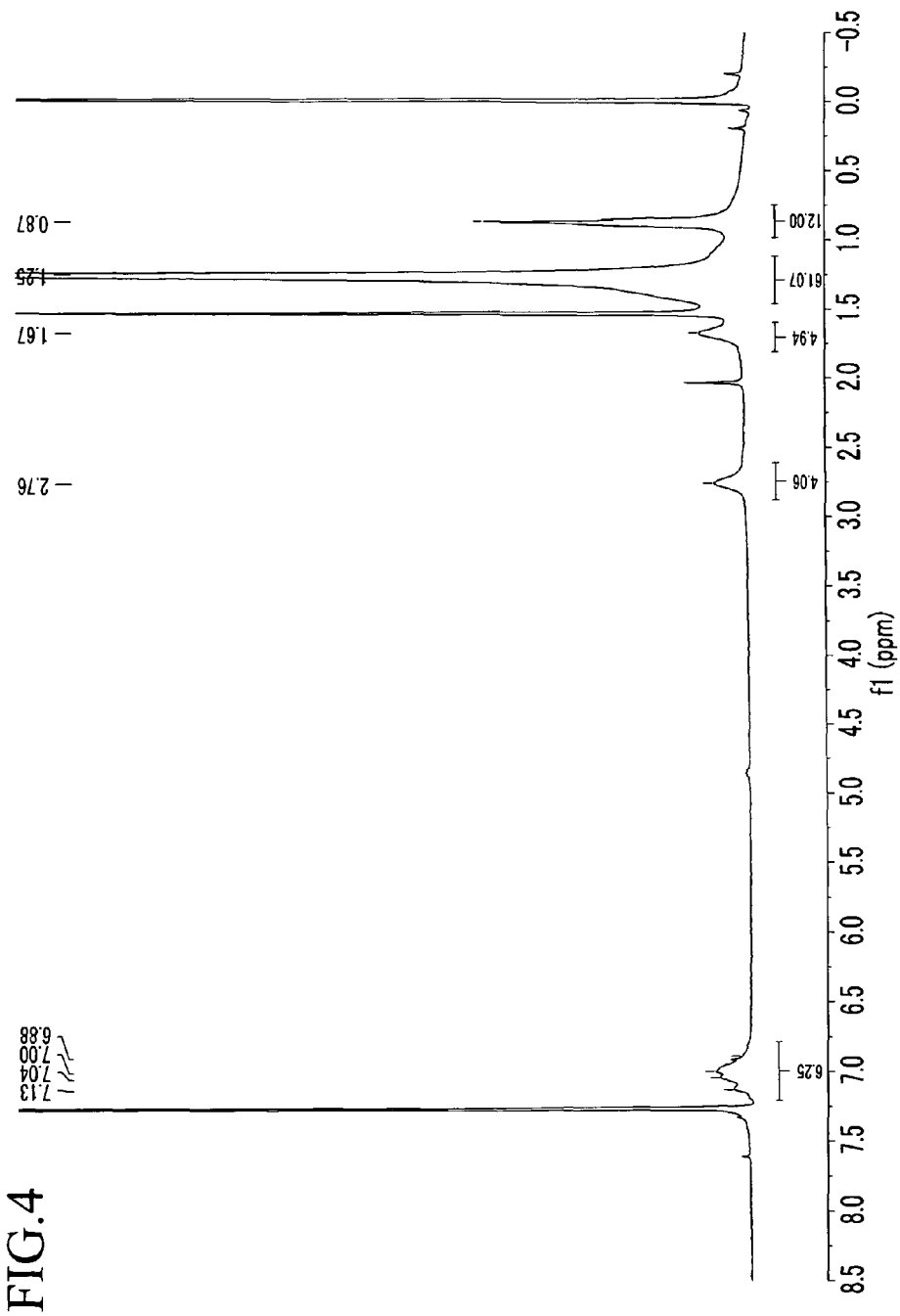

The $^1$H NMR of the compound of above Chemical Formula (1-4) is shown in FIG. 4.

Example 3

Manufacturing Organic Thin Film Transistor (OTFT)

A gate electrode 14 of chromium is deposited at 1000-Å on a cleaned glass substrate 12 by sputtering, and an insulation layer 16 of $SiO_2$ is deposited thereon at 3000-Å by a CVD method. Gold (Au) is then deposited at 700-Å thereon by sputtering to provide a source electrode 17a and a drain electrode 17b. The glass substrate 12 is washed for 10 minutes using isopropyl alcohol, and dried before coating the organic semiconductor material. The insulation layer of $SiO_2$ is treated with a combination of ultra violet light and ozone ($UV/O_3$) for 30 minutes before the surface modification. The device is dipped in an octyltrichloro silane solution that is diluted in n-hexane at a concentration of 10-mM for 30 minutes, and then the device is washed with hexane and alcohol and then dried. The polymer obtained from Example 1 is dissolved in chlorobenzene to a concentration of 1.0-wt % and coated on the device by spin-coating, and then baked at 150° C. for one hour under a nitrogen atmosphere to provide an active layer 18, thereby forming an OTFT device 10 having the structure shown in FIG. 1.

Example 4

Manufacturing Organic Thin Film Transistor (OTFT)

An OTFT device 10 having a structure shown in FIG. 1 is manufactured in accordance with the same procedure as in Example 3, except for using the polymer obtained from Example 2 instead of the polymer obtained from Example 1.

Comparative Example 1

Manufacturing Organic Thin Film Transistor (OTFT)

An OTFT device 10 having a structure shown in FIG. 1 is manufactured in accordance with the same procedure as in Example 3, except for using the polymer (number average molecular weight: 63,000) having a repeating unit of the following Chemical Formula (10).

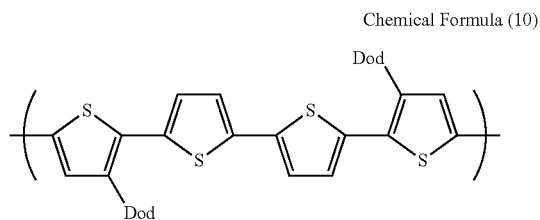

Chemical Formula (10)

In the above Chemical Formula (10), Dod denotes a dodecyl ($C_{12}H_{25}$).

Electrical Stability Comparison

Figure 5:
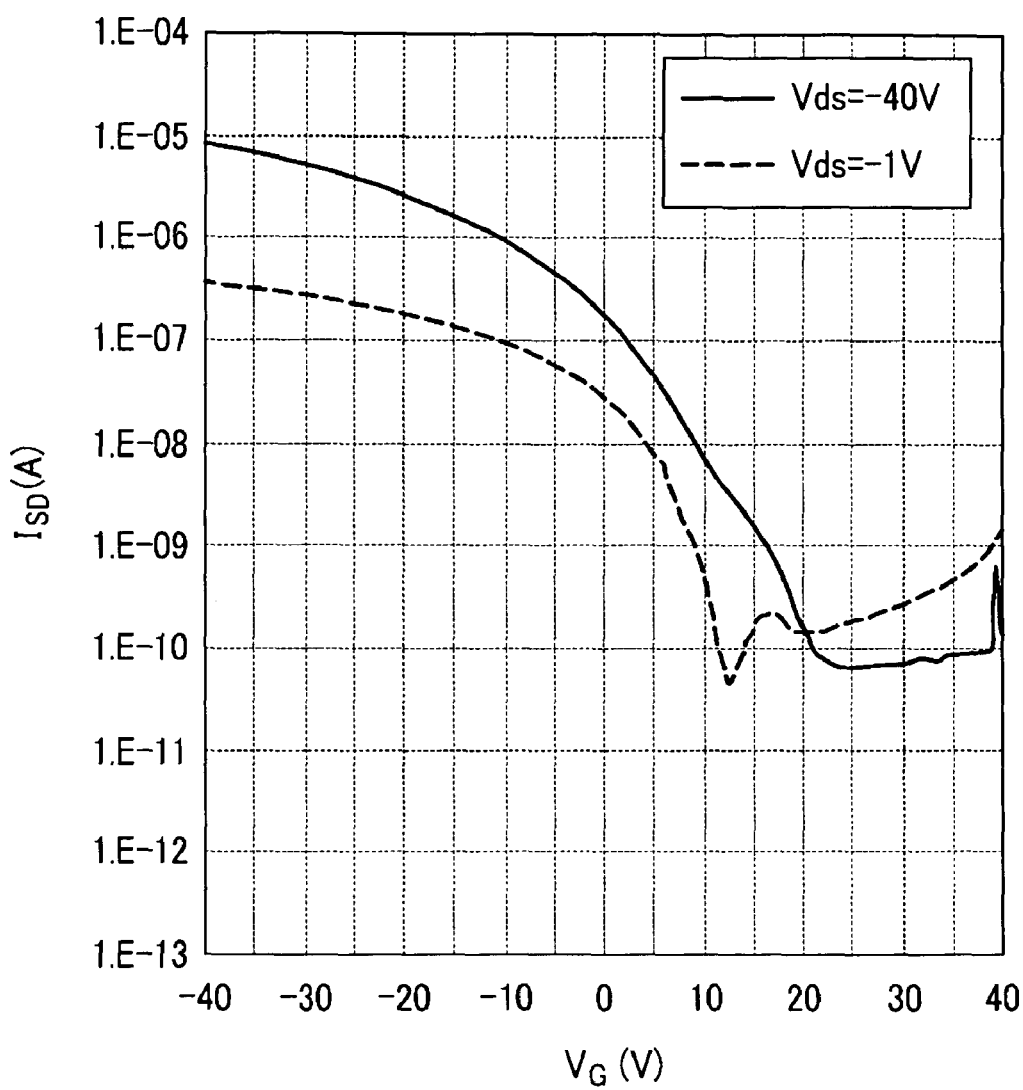
Figure 6:
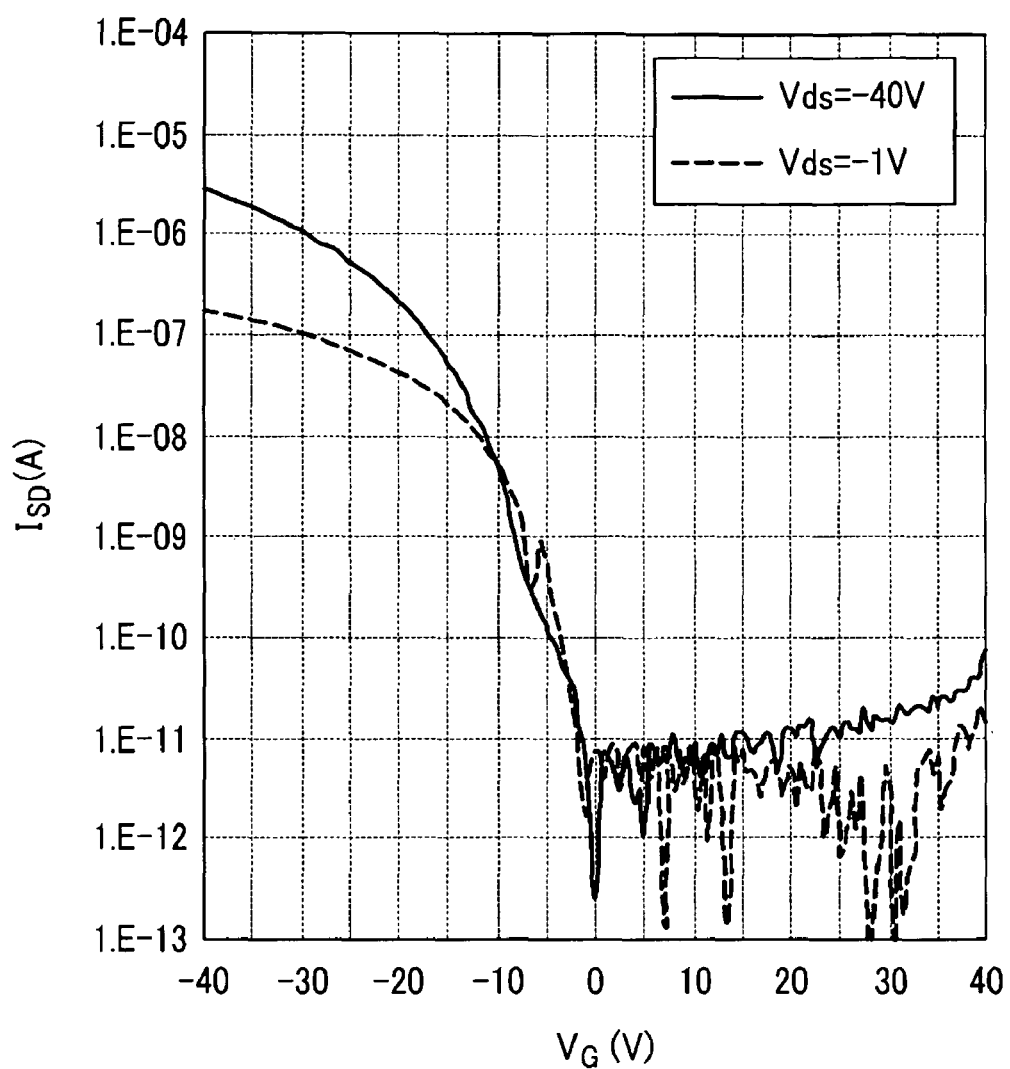
Figure 7:
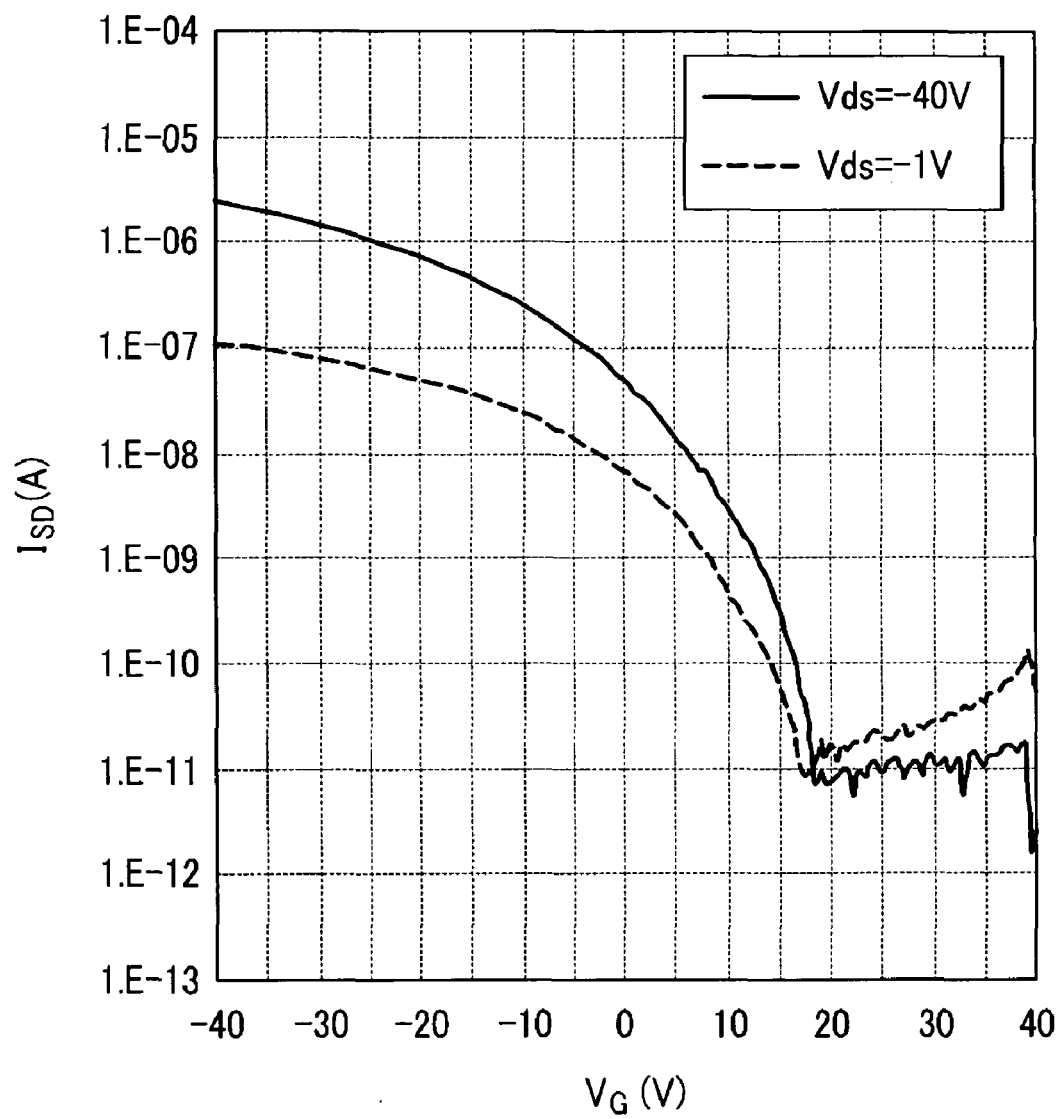

The OTFT devices according to Example 3, Example 4 and Comparative Example 1 are measured for current-transfer characteristics using a semiconductor characterization system (4200-SCS, KEITHLEY CORP.). The results are shown in FIGS. 5, 6 and 7, respectively. In FIGS. 5, 6 and 7, $I_{SD}$ is the source-drain current, $V_G$ is the gate voltage.

Electrical characteristics are summarized in Table 1.

TABLE 1

| DEVICE | CHARGE MOBILITY (cm²/Vs) | CURRENT ON/OFF RATIO ($I_{ON}/I_{OFF}$) |
|---|---|---|
| Example 3 | 0.058 | >10⁵ |
| Example 4 | 0.056 | >10⁵ |
| Comparative Example 1 | 0.021 | >10⁵ |

The charge mobility of Table 1 is obtained from a slope of a graph of $(I_{SD})^{1/2}$ and $V_G$ parameters are obtained from the following current Equation (1) in a saturation region.

$$I_{SD} = \frac{WC_0}{2L}\mu(V_G - V_T)^2 \quad \text{Equation (1)}$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the current Equation (1), $I_{SD}$ refers to a source-drain current, m or $m_{FET}$ refers to charge mobility, $C_O$ refers to oxide layer capacitance, W is a channel width, L is a channel length, $V_G$ is a gate voltage and $V_T$ is a threshold voltage.

Current on/off ratio ($I_{on}/I_{off}$) is a ratio of an on-state maximum current value ($I_{on}$) with respect to an off-state minimum current value ($I_{off}$).

As shown in Table 1, the devices according to Examples 3 and 4 show about 2.6 times higher charge mobility than that of Comparative Example 1.

The organic semiconductor polymers according to example embodiments may be used in the active region of an organic thin film transistor (OTFT) of an image display device (e.g., a flat panel display such as a liquid crystal display (LCD), an organic light emitting diode (OLED) display, a plasma display panel (PDP), a surface-conduction electron-emitter display (SED) and similar devices), a memory device, a photosensor, a laser device, a photovoltaic device (e.g., a solar cell) and similar devices.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments are to be understood to be exemplary but not limiting this disclosure in any way.

What is claimed is:

1. An organic semiconductor polymer represented by the following Chemical Formula (1):

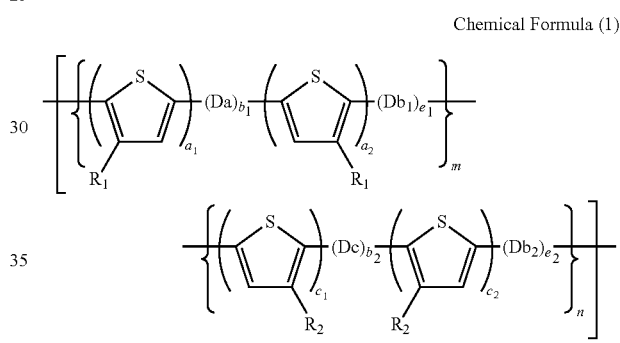

Chemical Formula (1)

wherein, in the above Chemical Formula (1),

R1 and R2 are the same or different, and are independently selected from the group consisting of a substituted or unsubstituted C1 to C20 linear or branched alkyl, a substituted or unsubstituted C3 to C20 cycloalkyl, a substituted or unsubstituted C1 to C20 alkoxyalkyl, a substituted or unsubstituted C1 to C20 linear or branched alkoxy, a substituted or unsubstituted C3 to C20 oxycycloalkyl, a substituted or unsubstituted C6 to C20 oxyaryl, a C1 to C20 perfluoroalkyl, a substituted or unsubstituted C1 to C20 fluoroalkyl and combinations thereof, Da, $Db_1$, $Db_2$, and Dc are the same or different, and are independently selected from the group consisting of a substituted or unsubstituted C2 to C30 heteroaromatic group, a substituted or unsubstituted C6 to C30 condensed polycyclic group, a substituted or unsubstituted C6 to C30 arylene, a substituted or unsubstituted C2 to C30 heteroaromatic group including at least one electron-withdrawing imine nitrogen atom and combinations thereof, a is from 1 to 4, $b_1$ and $b_2$ is from 0 to 4, c is from 1 to 4, $e_1$ and $e_2$ is from 0 to 3, and m and n denotes a mole ratio of each repeating unit and m:n is from 10:1 to 1:10.

2. The organic semiconductor polymer of claim 1, wherein Da, Db$_1$, Db$_2$, and Dc are functional groups represented by one of the structures shown in the following Chemical Formula (2):

Chemical Formula (2)

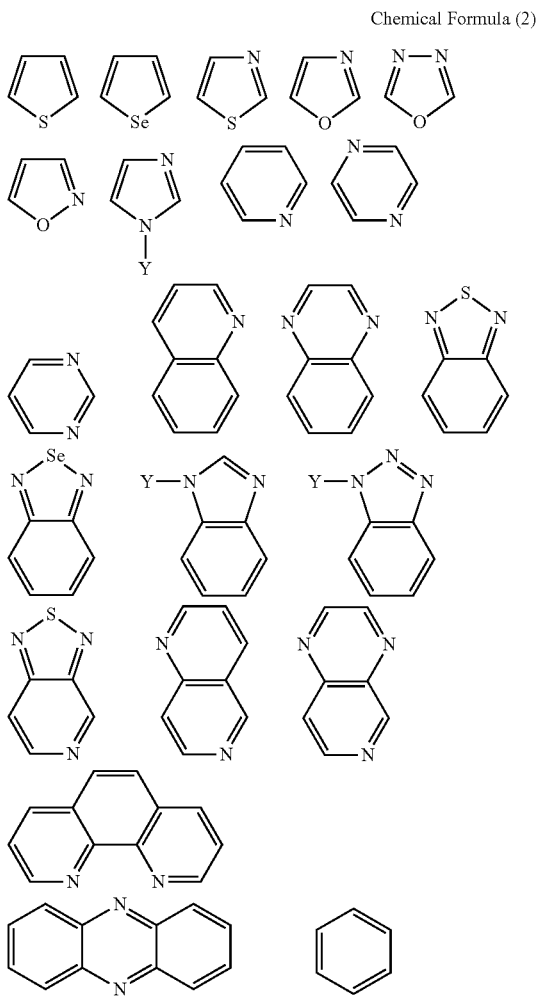

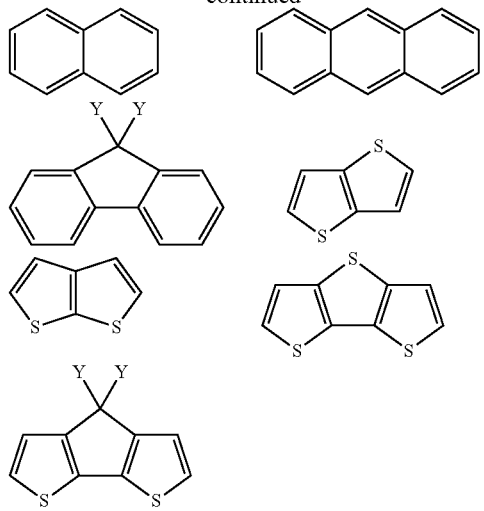

wherein, in the structures represented in the above Chemical Formula (2), Y is hydrogen, a C1 to C20 linear or branched alkyl, a C3 to C20 cycloalkyl, a C6 to C30 aryl, a C1 to C16 linear or branched alkoxy, or a C3 to C16 cycloalkoxyalkyl.

3. The organic semiconductor polymer of claim 1, wherein the C2 to C30 heteroaromatic group is thiophene or thienothiophene.

4. The organic semiconductor polymer of claim 1, wherein the C2 to C30 heteroaromatic group including at least one electron-withdrawing imine nitrogen atom is at least one selected from the group consisting of thiazole, thiadiazole, oxazole, isoxazole, oxadiazole, imidazole, pyrazole, triazole, tetrazole, pyridine, pyridazine, quinoline, isoquinoline, quinoxaline, naphthyridine, benzoimidazole, pyrimidine, pyrimidopyrimidine, benzothiadiazole, benzoselenadiazole, benzotriazole, benzothiazole, benzooxazole, phenanthroline, phenazine, pyrazine, triazine, pyridopyrimidine, phenaphthyridine and combinations thereof.

5. The organic semiconductor polymer of claim 1, wherein the organic semiconductor polymer is a polymer having at least one of the repeating units represented by the following Chemical Formulae (1-1), (1-2), (1-3) or combinations thereof:

Chemical Formula (1-1)

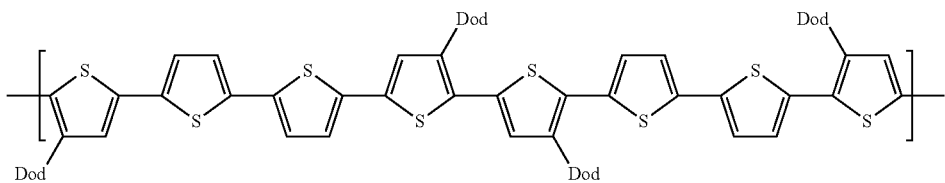

Chemical Formula (1-2)

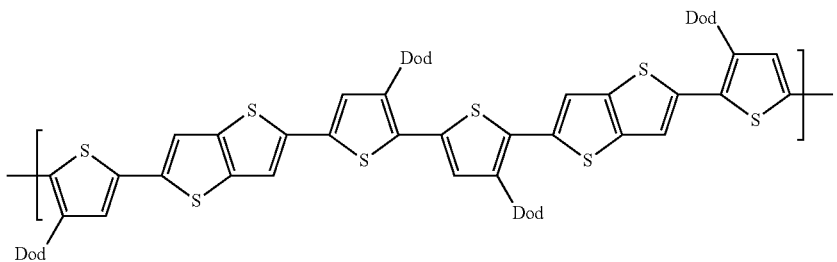

-continued

Chemical Formula (1-3)

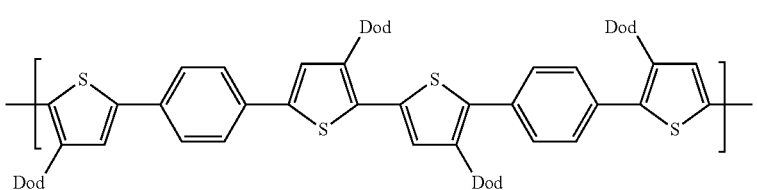

wherein, in the above Chemical Formulae (1-1) to (1-3), Dod denotes a dodecyl ($C_{12}H_{25}$).

6. The organic semiconductor polymer of claim 1, wherein the organic semiconductor polymer includes a terminal functional group represented by one of the following Chemical Formulae (3), (4), (5) and (6):

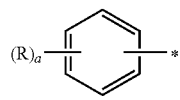

Chemical Formula (3)

wherein, in the above Chemical Formula (3), R is a fluoro or a C1 to C20 perfluoroalkyl and a is an integer ranging from 1 to 5,

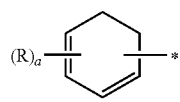

Chemical Formula (4)

wherein, in the above Chemical Formula (4), R is a fluoro or a C1 to C20 perfluoroalkyl and a is an integer ranging from 1 to 6,

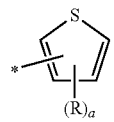

Chemical Formula (5)

wherein, in the above Chemical Formula (5), R is a fluoro or a C1 to C20 perfluoroalkyl and a is an integer ranging from 1 to 3, and

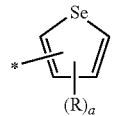

Chemical Formula (6)

wherein, in the above Chemical Formula (6), R is a fluoro or a C1 to C20 perfluoroalkyl and a is an integer ranging from 1 to 3.

7. The organic semiconductor polymer of claim 1, wherein the organic semiconductor polymer has a number average molecular weight (Mn) of about 10,000 to about 100,000.

8. A transistor, comprising the organic semiconductor polymer according to claim 1.

9. The transistor of claim 8, wherein Da, $Db_1$, $Db_2$ and Dc are functional groups represented by one of the structures shown in the following Chemical Formula (2):

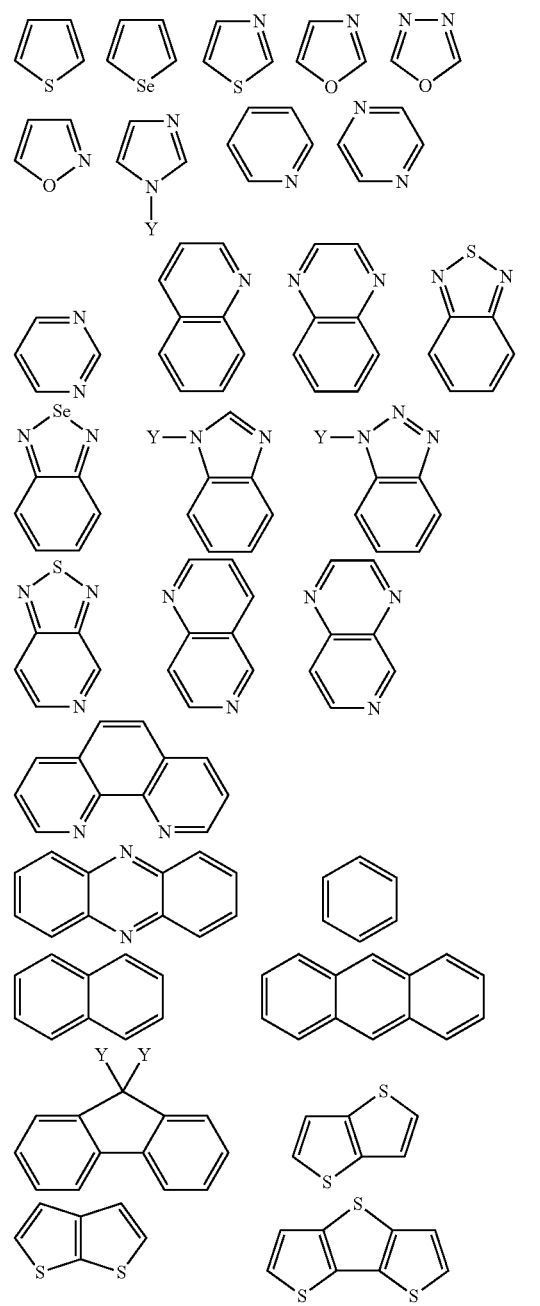

Chemical Formula (2)

-continued

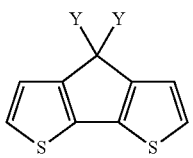

wherein, in the structures represented in the above Chemical Formula (2), Y is hydrogen, a C1 to C20 linear or branched alkyl, a C3 to C20 cycloalkyl, a C6 to C30 aryl, a C1 to C16 linear or branched alkoxy or a C3 to C16 cycloalkoxyalkyl.

10. The transistor of claim 8, wherein the C2 to C30 heteroaromatic group is thiophene or thienothiophene.

11. The transistor of claim 8, wherein the C2 to C30 heteroaromatic group including at least one electron-withdrawing imine nitrogen atom is at least one selected from the group consisting of thiazole, thiadiazole, oxazole, isoxazole, oxadiazole, imidazole, pyrazole, triazole, tetrazole, pyridine, pyridazine, quinoline, isoquinoline, quinoxaline, naphthyridine, benzoimidazole, pyrimidine, pyrimidopyrimidine, benzothiadiazole, benzoselenadiazole, benzotriazole, benzothiazole, benzooxazole, phenanthroline, phenazine, pyrazine, triazine, pyridopyrimidine, phenaphthyridine and combinations thereof.

12. The transistor of claim 8, wherein the organic semiconductor polymer is a polymer having at least one of the repeating units represented by the following Chemical Formulae (1-1), (1-2), (1-3) or combinations thereof:

wherein, in the above Chemical Formulae (1-1), (1-2) and (1-3), Dod denotes a dodecyl ($C_{12}H_{25}$).

13. The transistor of claim 8, wherein the organic semiconductor polymer includes a terminal functional group represented by one of the following Chemical Formulas (3), (4), (5) and (6):

Chemical Formula (3)

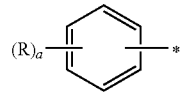

wherein, in the above Chemical Formula (3), R is a fluoro or a C1 to C20 perfluoroalkyl, and a is an integer ranging from 1 to 5, Chemical Formula (4)

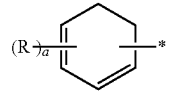

wherein, in the above Chemical Formula (4), R is a fluoro or a C1 to C20 perfluoroalkyl, and a is an integer ranging from 1 to 6, Chemical Formula (1-1)

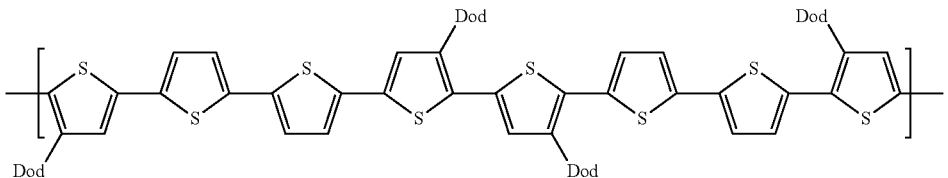

Chemical Formula (1-2)

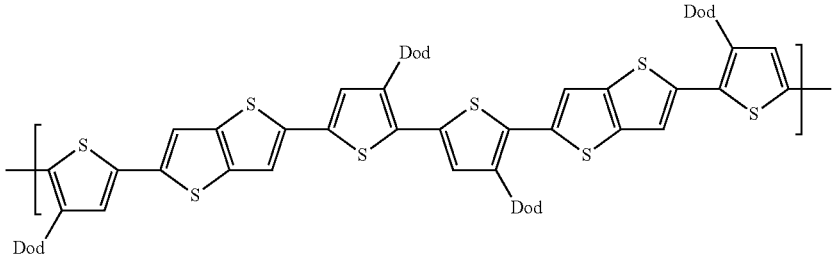

Chemical Formula (1-3)

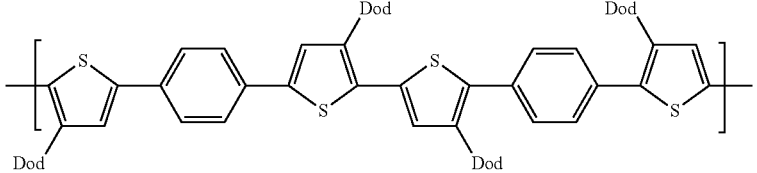

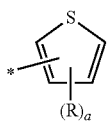

Chemical Formula (5)

wherein, in the above Chemical Formula (5), R is a fluoro or a C1 to C20 perfluoroalkyl, and a is an integer ranging from 1 to 3, and

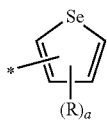

Chemical Formula (6)

wherein, in the above Chemical Formula (6), R is a fluoro or a C1 to C20 perfluoroalkyl and a is an integer ranging from 1 to 3.

14. The transistor of claim 8, wherein the organic semiconductor polymer has a number average molecular weight (Mn) of about 10,000 to about 100,000.

15. The transistor of claim 8, further comprising:
a gate electrode on a substrate;
a source electrode and a drain electrode facing each other and defining a channel region, the gate electrode being interposed between the source electrode and the drain electrode;
an insulation layer that electrically insulates the source electrode, the drain electrode and the gate electrode; and
an active layer in the channel region, the active layer including the organic semiconductor polymer.

16. An electronic device, comprising the transistor according to claim 8.

17. An electronic device, comprising the organic semiconductor polymer according to claim 1.

* * * * *